(12) United States Patent
Takino

(10) Patent No.: US 11,361,973 B2
(45) Date of Patent: Jun. 14, 2022

(54) ETCHING METHOD AND ETCHING APPARATUS

(71) Applicant: Tokyo Electron Limited, Tokyo (JP)

(72) Inventor: Yusuke Takino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/111,582

(22) Filed: Dec. 4, 2020

(65) Prior Publication Data

US 2021/0175090 A1 Jun. 10, 2021

(30) Foreign Application Priority Data

Dec. 6, 2019 (JP) .............................. JP2019-221388

(51) Int. Cl.
| | |
|---|---|
| H01L 21/311 | (2006.01) |
| H01L 21/02 | (2006.01) |
| H01J 37/32 | (2006.01) |
| H01L 21/67 | (2006.01) |

(52) U.S. Cl.
CPC .... H01L 21/31116 (2013.01); H01J 37/3244 (2013.01); H01J 37/32715 (2013.01); H01L 21/02271 (2013.01); H01L 21/31144 (2013.01); H01L 21/67069 (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2013/0189845 A1* | 7/2013 | Kim ................. | H01L 21/31144 438/696 |
| 2016/0005596 A1* | 1/2016 | Behera ............. | H01L 21/31116 438/703 |
| 2019/0172718 A1* | 6/2019 | Kubota ............ | H01L 21/31144 |
| 2020/0043709 A1* | 2/2020 | Agarwal .............. | C23C 16/505 |

FOREIGN PATENT DOCUMENTS

| | | |
|---|---|---|
| JP | 2009-099938 A | 5/2009 |
| JP | 2012-178378 A | 9/2012 |

* cited by examiner

*Primary Examiner* — Shamim Ahmed
(74) *Attorney, Agent, or Firm* — Pearne & Gordon LLP

(57) ABSTRACT

An etching method includes preparing a substrate having a processing target film, multiple core members formed on the processing target film, and a first film covering the multiple core members and the processing target film exposed between the multiple core members; forming a second film on a surface of the first film by a first gas; etching the first film by plasma of a second gas while allowing the second film to be left on a portion of the first film corresponding to a side surface of each core member; and repeating the forming of the second film and the etching of the first film.

11 Claims, 8 Drawing Sheets

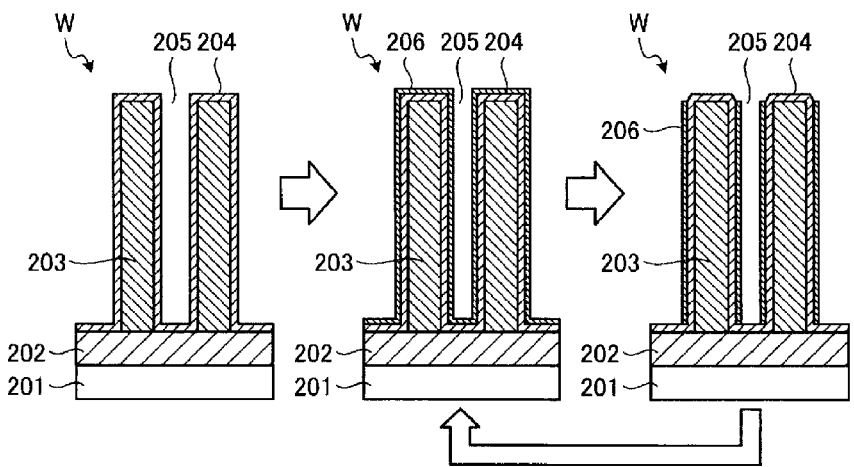
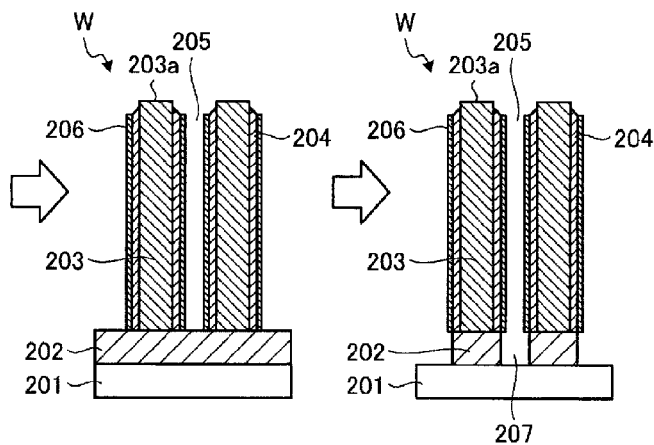

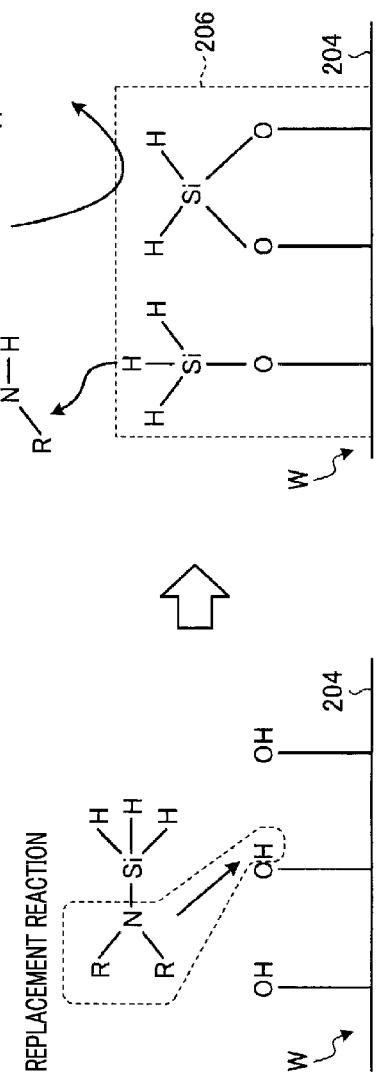

ETCHING METHOD AND ETCHING APPARATUS

CROSS-REFERENCE TO RELATED APPLICATION

This application claims the benefit of Japanese Patent Application No. 2019-221388 filed on Dec. 6, 2019, the entire disclosure of which is incorporated herein by reference.

TECHNICAL FIELD

The various aspects and embodiments described herein pertain generally to an etching method and an etching apparatus.

BACKGROUND

Conventionally, as a technique of forming a fine pattern on a substrate by etching, there is known self-aligned multi patterning (SAM) of forming a mask pattern by using a multiple number of core members formed on a processing target film.
Patent Document 1: Japanese Patent Laid-open Publication No. 2009-099938
Patent Document 2: Japanese Patent Laid-open Publication No. 2012-178378

SUMMARY

In one exemplary embodiment, there is provided an etching method including preparing a substrate having a processing target film, multiple core members formed on the processing target film, and a first film covering the multiple core members and the processing target film exposed between the multiple core members; forming a second film on a surface of the first film by a first gas; etching the first film by plasma of a second gas while allowing the second film to be left on a portion of the first film corresponding to a side surface of each core member; and repeating the forming of the second film and the etching of the first film.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A to FIG. 2E are diagrams showing examples of a substrate state in individual processes of the etching method according to the exemplary embodiment;

FIG. 3 is an explanatory diagram for describing a protective film forming process in the exemplary embodiment in detail;

DETAILED DESCRIPTION

Figure 1:
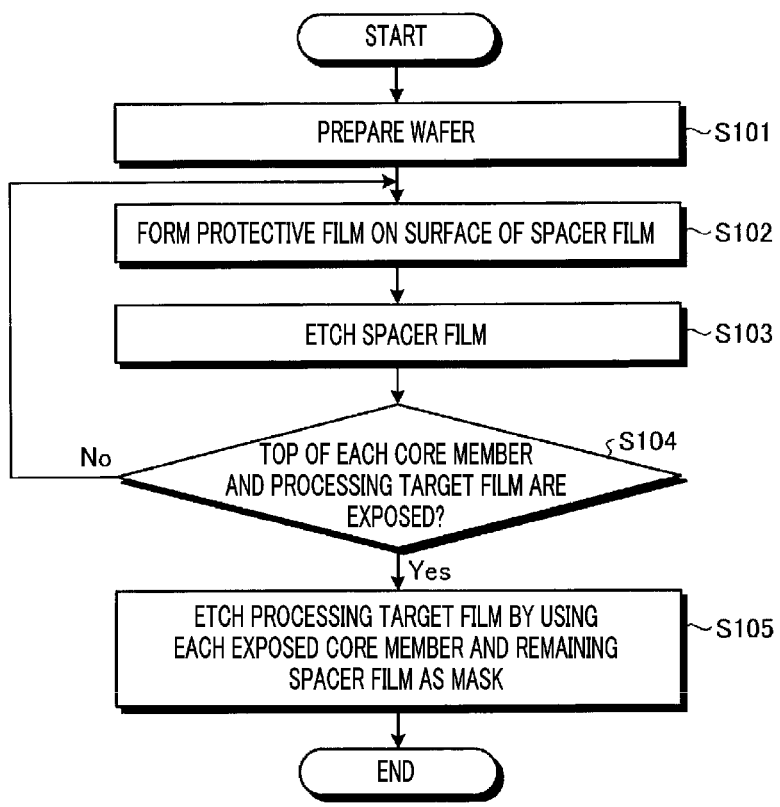
FIG. 1 is a flowchart illustrating an example flow of an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

In SAMP, there is prepared a substrate having, for example, a processing target film; a multiple number of core members formed on the processing target film; and a spacer film covering the core members and the processing target film exposed between the core members. In the SAMP, the spacer film is first etched to thereby expose the core members and the processing target film. Accordingly, a mask composed of the core members and the spacer film left on side surfaces of the individual core members is formed. Then, by using the core members and the spacer film left on the side surfaces of the core members as the mask, the processing target film underneath it is etched.

In the SAMP, however, a shape of the mask may become abnormal when etching the spacer film. That is, when the core members and the processing target film are exposed by etching the spacer film, the core members having exposed tops exist on the processing target film, and the spacer film remains on both side surfaces of each core member. Here, both shoulder portions of a top surface of the spacer film with the core member therebetween may be rounded by being cut by etching. As a result, the mask may become to have an abnormal shape where a widthwise size of the mask at the shoulder portions of the spacer film is reduced. This abnormality in the shape of the mask is also called as leading end thinning. If the abnormality of the shape of the mask occurs, the function of the mask may be impaired in the etching of the processing target film following the etching of the spacer film.

In this regard, it is required to suppress the abnormality in the shape of the mask formed on the substrate by the etching.

[Example Flow of Etching Method]

FIG. 1 is a flowchart illustrating an example flow of an etching method according to an exemplary embodiment. FIG. 2A to FIG. 2E are diagrams illustrating examples of a substrate state in individual processes of the etching method according to the exemplary embodiment. The exemplary embodiment will be described for an example case where a substrate is a semiconductor wafer (hereinafter, simply referred to as "wafer") W, and a mask pattern is formed on the wafer W and a processing target film is etched by using this mask pattern.

First, the wafer W is provided (process S101, FIG. 2A). By way of example, the wafer W having a processing target film 202 formed on a semiconductor substrate 201; a multiple number of core members 203 formed on the processing target film 202; and a spacer film 204 covering the respective core members 203 and the processing target film 202 exposed between the multiple number of core members 203 is placed in a chamber.

The processing target film 202 is, by way of non-limiting, amorphous silicon, silicon oxide ($SiO_2$) or a silicon nitride film (SiN). The core member 203 may be, by way of non-limiting example, an organic film, amorphous silicon, silicon oxide ($SiO_2$) or silicon nitride (SiN). The core member 203 is formed to have a column shape standing upright from the processing target film 202. Openings 205 through which the processing target film 202 is exposed are formed between the multiple number of core members 203.

The spacer film 204 is formed by, for example, CVD (Chemical Vapor Deposition) ALD (Atomic Layer Deposition), or the like. The spacer film 204 may be, by way of example, but not limitation, silicon (Si), silicon nitride (SiN) or carbon (C). When the spacer film 204 is formed, the silicon (Si), the silicon nitride (SiN) or the carbon (C) forming the spacer film 204 is conformally deposited. As a result, the spacer film 204 covers the individual core members 203 and the processing target film 202 exposed in the openings 205. The spacer film 204 is an example of a first film.

Then, a protective film 206 is formed on a surface of the spacer film 204 by using a first gas (process S102, FIG. 2B). By way of example, the first gas is supplied onto the wafer W, and the protective film 206 is formed as molecules of the first gas are adsorbed into the surface of the spacer film 204. The protective film 206 is, by way of non-limiting example, silicon oxide. An aminosilane-based gas or a silicon alkoxide-based gas may be used as the first gas. The aminosilane-based gas may be, by way of example, but not limitation, one or more gases selected from BTBAS (Bistertiarybutylaminosilane), BDMAS (Bisdimethylaminosilane), BDEAS (Bisdiethylaminosilane), DMAS (dimethylaminosilane), DEAS (diethylaminosilane), DPAS (Dipropylaminosilane), BAS (Butylaminosilane), BEMAS (Bisethylmethylaminosilane), TDMAS (Tridimethylaminosilane), HDMS (hexamethyldisilazane), DMSDMA (Dimethylsilyldimethylamine), TMSDMA (Dimethilaminotrimethylsilane), TMMAS (Trimethylmethylaminosilane), TMICS (Trimethyl(isocyanato)silane), TMSA (Trimethylsilylacetylene), and TMSC (Trimethylsilylcyanide). The silicon alkoxide-based gas may be, by way of non-limiting example, TEOS (Tetraethoxysilane). The protective film 206 is an example of a second film.

Here, this process of forming the protective film 206 (process S102, FIG. 2B) will be explained in further detail with reference to FIG. 3. FIG. 3 is an explanatory diagram for describing the protective film forming process according to the exemplary embodiment in detail. As shown in the left side of FIG. 3, if the aminosilane-based gas is supplied onto the wafer W as the first gas, for example, a replacement reaction takes place between a hydroxyl group (OH group) existing on the surface of the spacer film 204 and a molecule of the aminosilane-based gas. That is, among an amine group and a silyl group constituting the molecule of the aminosilane-based gas, the replacement reaction occurs between a portion of the amine group and the OH group existing on the surface of the spacer film 204. Then, as shown in the right side of FIG. 3, the silyl group combines with an oxygen atom of the OH group on the spacer film 204, so that silicon oxide is chemically adsorbed to the surface of the spacer film 204. As a result, the protective film 206 having a thickness corresponding to a single molecular layer of the silicon oxide is formed on the surface of the spacer film 204. Further, since an end of the silyl group is terminated with a hydrogen atom, a replacement reaction for another molecule of the aminosilane-based gas is not incurred. Further, the hydrogen atom of the silyl group may undergo a replacement reaction with a nearby OH group on the surface of the spacer film 204, and may be linked thereto, as shown in the right side of FIG. 3.

Reference is made back to FIG. 1 and FIG. 2A to FIG. 2E. Subsequently, the spacer film 204 is etched by plasma of a second gas while allowing the protective film 206 to remain on portions of the spacer film 204 corresponding to side surfaces of each core member 203 (process S103, FIG. 2C). By way of example, by supplying the second gas onto the wafer W and forming the plasma of the second gas, the spacer film 204 is etched. At this time, the spacer film 204 is etched under the condition that an etching rate of the portion of the spacer film 204 corresponding to the side surface of each core member 203 is smaller than an etching rate of the rest portion of the spacer film 204. For example, a processing condition such as a value of an applied high frequency (RF) power is adjusted to reduce the etching rate of the portion of the spacer film 204 corresponding to the side surface of each core member 203 as ions are attracted toward a top portion of each core member 203 and the processing target film 202 between the core members 203. Accordingly, while the portion of the spacer film 204 corresponding to the side surface of each core member 203 is protected by the protective film 206, a portion covering the top portion 203a of each core member 203 and a portion covering the processing target film 202 exposed between the core members 203 are etched along with the protective film 206. Further, it is desirable to end the etching of the spacer film 204 before the protective film 206 on the portion of the spacer film 204 corresponding to the side surface of each core member 203 is removed. For example, by performing the etching while adjusting an etching time or the like, the protective film 206 can be left on the portion of the spacer film 204 corresponding to the side surface of each core member 203. By allowing the protective film 206 to be left on the portion of the spacer film 204 corresponding to the side surface of each core member 203, a size of the opening 205 in the horizontal direction shown in FIG. 2A in the state that it is covered with the spacer film 204 is maintained even after the etching of the spacer film 204. Further, the protective film 206 may not remain in the whole period during which the spacer film 204 is etched. That is, the etching of the spacer film 204 may be ended upon the lapse of a predetermined time after the protective film 206 on the portion of the spacer film 204 corresponding to the side surface of each core member 203 is removed. In this case, during a time period in which the preset time elapses after the protective film 206 is removed, the portion of the spacer film 204 corresponding to the side surface of each core member 203 is slightly etched, so that the size of the opening 205 in the horizontal direction in FIG. 2A in the state that it is covered with the spacer film 204 tends to be enlarged. According to the present etching method, however, it is possible to minimize an increase of an etching processing time, which is caused when the processes S102 to S103 are repeated as will be described later, while minimizing the enlargement of the size of the opening 205 in the horizontal direction.

Further, various kinds of gases may be used as the second gas depending on the kind of the spacer film 204. When the spacer film 204 is silicon (Si), for example, the second gas may be $HBr/O_2$. Further, when the spacer film 204 is silicon nitride (SiN), the second gas may be $CH_3F/O_2$. Furthermore, when the spacer film 204 is carbon (C), the second gas may be $CO_2$ or $N_2/H_2$.

Subsequently, after the spacer film 204 is etched in the processes S102 and S103, it is determined whether the top portion 203a of each core member 203 and the processing target film 202 between the core members 203 are exposed (process S104). This determination in the process S104 is carried out based on, for example, whether the processes S102 and S103 are repeated a preset number of times. If it is determined that the top portion 203a of each core member 203 and the processing target film 202 between the core members 203 are not exposed (process S104: No), the processes S102 and S103 are repeated. By repeating the processes S102 and S103, the top portion 203a of each core member 203 and the processing target film 202 between the core members 203 are exposed (FIG. 2D). Accordingly, a mask formed of the exposed core members 203 and the spacer film 204 left on the side surface of each core member 203 is obtained. Since a shoulder portion of the spacer film 204, which may be given an abnormal shape because of the etching, is protected by the protective film 206, occurrence of abnormality in the shape of the mask is suppressed. For example, leading end thinning of the mask is suppressed, so that the mask has a rectangular cross sectional shape substantially perpendicular to the processing target film 202.

If it is determined that the top portion 203a of each core member 203 and the processing target film 202 between the core members 203 are exposed (process S104: Yes), the processing target film 202 is etched (process S105, FIG. 2E). That is, the processing target film 202 is etched by using each exposed core member 203 and the spacer film 204 remaining on the side surface of each core member 203 as the mask. As a result, an opening 207 corresponding to the opening 205 is formed in the processing target film 202. Since the cross sectional shape of the mask is a rectangle, the opening 207 also has a rectangular cross sectional shape.

Figure 4:
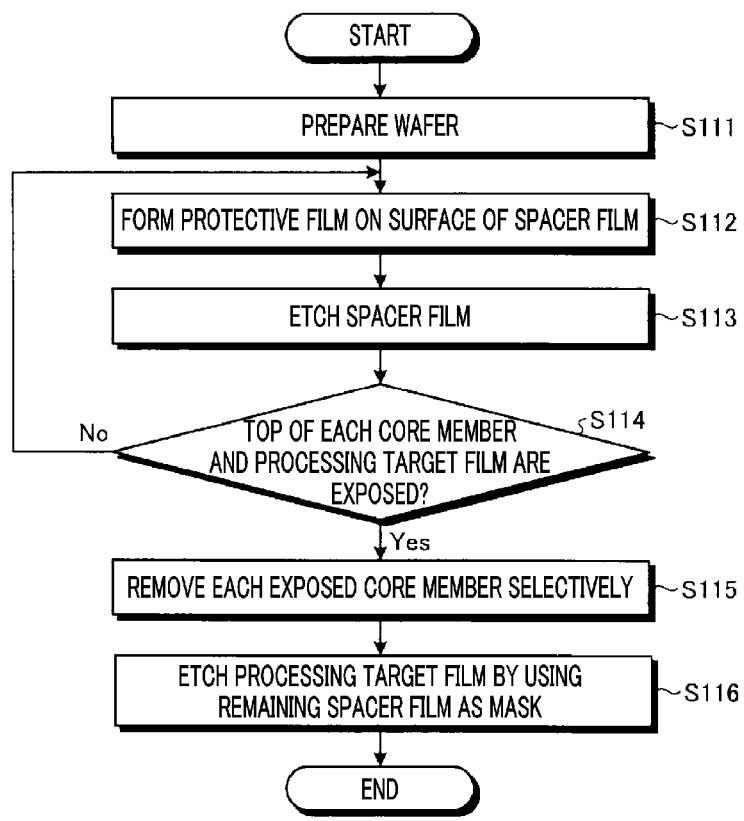
FIG. 4 is a flowchart illustrating an example flow of an etching method according to another exemplary embodiment.

FIG. 4 is a flowchart illustrating an example flow of an etching method according to another exemplary embodiment. FIG. 5A to FIG. 5F are diagrams illustrating examples of a substrate state in individual processes of the etching method according to the another exemplary embodiment. In the above-described exemplary embodiment, the processing target film 202 is etched by using the core members 203 exposed as a result of the etching of the spacer film 204 and the spacer film 204 left on the side surface of each core member 203 as the mask. In the another exemplary embodiment, however, after each core member 203 which is exposed as the spacer film 204 is etched is selectively removed, the processing target film 202 is etched by using the remaining spacer film 204 as a mask. Further, processes S111 to S114 in FIG. 4 are the same as the processes S101 to S104 in FIG. 1. Further, a wafer W shown in FIG. 5A to FIG. 5D are the same as the wafer W shown in FIG. 2A to FIG. 2D.

By repeating the processes S112 and S113, a spacer film 204 is etched, and a top portion 203a of each core member 203 and a processing target film 202 between the core members 203 are exposed (process S114: No, FIG. 5D).

If it is determined that the top portion 203a of each core member 203 and the processing target film 202 between the core members 203 are exposed (process S114: Yes), each exposed core member 203 is selectively removed (process S115, FIG. 5E). For example, by supplying a third gas onto the wafer W and forming plasma of the third gas, each exposed core member 203 is selectively removed. As each core member 203 is selectively removed, the spacer film 204 remains at positions with a space 208 therebetween. Here, the space 208 is formed by removing each core member 203. That is, a mask composed of the remaining spacer film 204 is formed at the positions with the space 208 therebetween. Since a shoulder portion of the spacer film 204, which may suffer an abnormal shape due to the etching, is protected by the protective film 206, occurrence of abnormality in the shape of the mask is suppressed. For example, leading end thinning of the mask is suppressed, so the mask has a rectangular cross sectional shape substantially perpendicular to the processing target film 202.

Figure 5A:
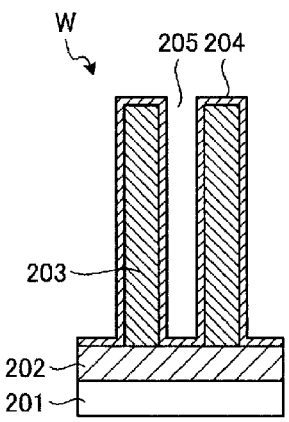
FIG. 5A to FIG. 5F are diagrams showing examples of a substrate state in individual processes in the etching method according to the another exemplary embodiment.
Figure 5B:
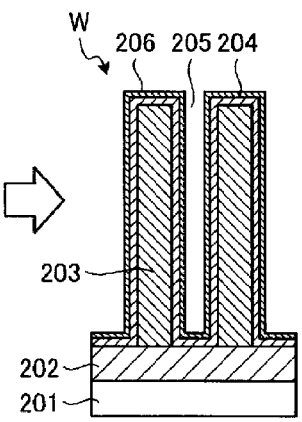
Figure 5C:
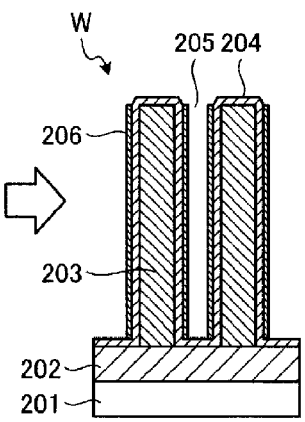
Figure 5D:
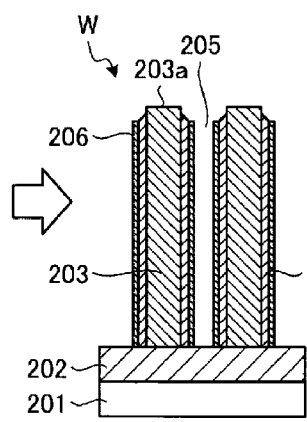
Figure 5E:
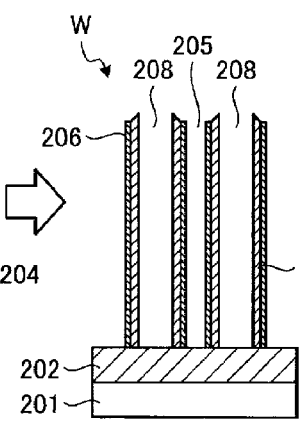
Figure 5F:
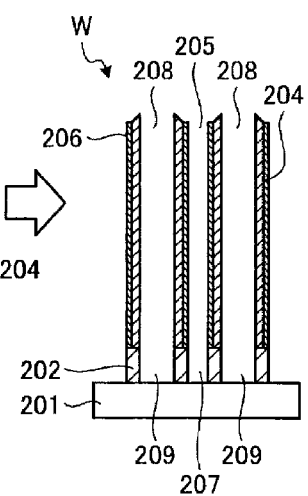

Then, by using the remaining spacer film 204 as the mask, the processing target film 202 is etched (process S116, FIG. 5F). As a result, an opening 207 corresponding to an opening 205 is formed in the processing target film 202. Further, an opening 209 corresponding to the space 208 existing between the remaining portions of the spacer film 204 is also formed. Since the mask has a rectangular cross sectional shape, the opening 207 and the opening 209 also have a rectangular cross sectional shape.

Further, the individual processes shown in FIG. 1 and FIG. 4 may be performed in a single processing chamber while maintaining a decompressed atmosphere therein, or may be performed continuously in different processing chambers connected via a transfer system.

[Example of Etching Apparatus]

Figure 6:
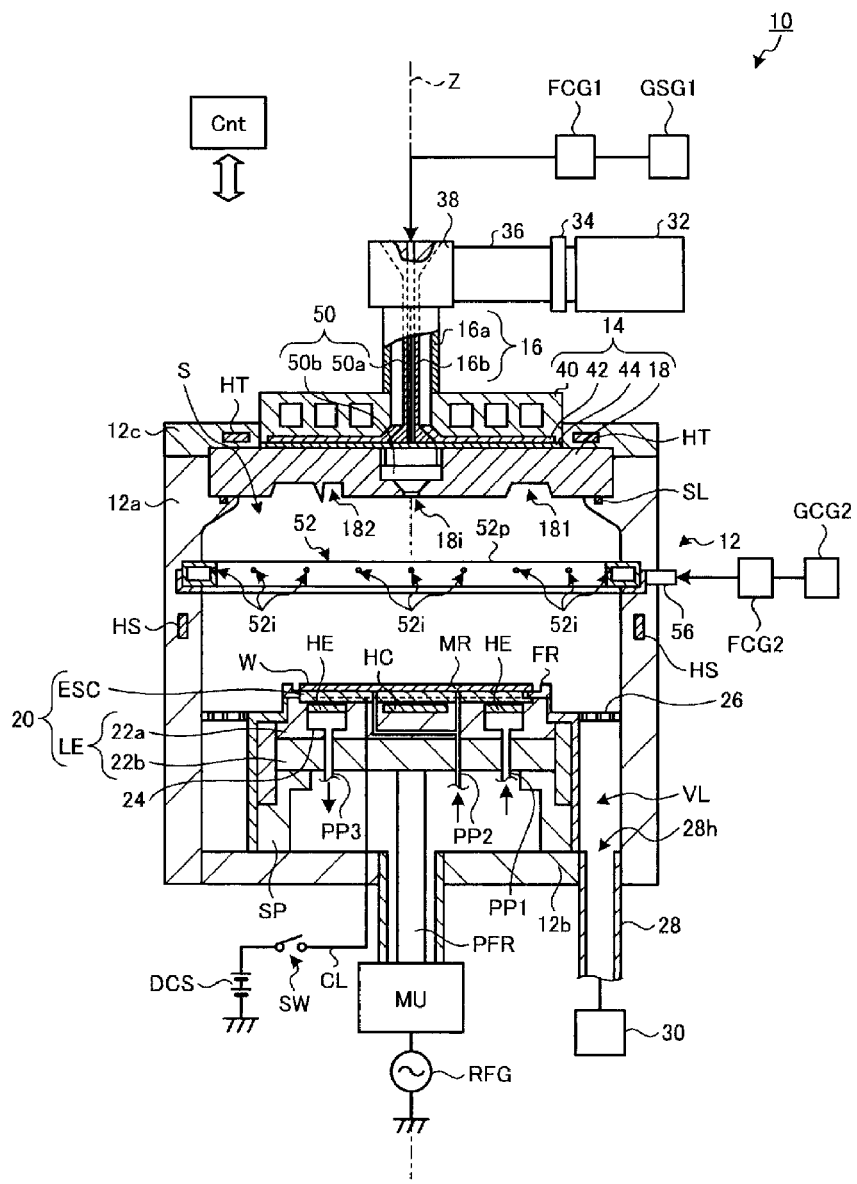
FIG. 6 is a diagram illustrating an example of an etching apparatus according to an exemplary embodiment.

FIG. 6 is a diagram illustrating an example of an etching apparatus according to an exemplary embodiment for use in performing the etching methods according to the above-described exemplary embodiments. FIG. 6 schematically illustrates a cross sectional structure of an etching apparatus 10. The etching apparatus 10 includes a chamber 12 as shown in FIG. 6. The chamber 12 provides a processing space S for accommodating a wafer W therein. The chamber 12 has a sidewall 12a, a bottom 12b and a ceiling 12c. The sidewall 12a has a substantially cylindrical shape having a Z-axis as an axis line. The Z-axis passes through, for example, a center of a placing table to be described later in a vertical direction.

The bottom 12b is provided at a lower end side of the sidewall 12a. Further, an upper end portion of the sidewall 12a is opened. This upper end opening of the sidewall 12a is closed by a dielectric window 18. The dielectric window 18 is held between the upper end portion of the sidewall 12a and the ceiling 12c. A sealing member SL may be provided between the dielectric window 18 and the upper end portion of the sidewall 12a. The sealing member SL may be, by way of example, an O-ring, and contributes to sealing of the chamber 12.

Within the chamber 12, a placing table 20 is provided under the dielectric window 18. The placing table 20 includes a lower electrode LE and an electrostatic chuck ESC. The lower electrode LE includes a first plate 22a and a second plate 22b which are made of, by way of example, aluminum and have a substantially circular plate shape. The second plate 22b is supported by a cylindrical supporting member SP. The supporting member SP is extended vertically upwards from the bottom 12b. The first plate 22a is disposed on the second plate 22b and electrically connected with the second plate 22b.

The lower electrode LE is electrically connected with a high frequency power supply RFG via a power feed rod PFR and a matching unit MU. The high frequency power supply RFG is configured to supply a high frequency bias power to the lower electrode LE. The high frequency bias power generated by the high frequency power supply RFG has a preset frequency of e.g., 13.56 MHz suitable for controlling energy of ions attracted into the wafer W. The matching unit MU incorporates therein a matching device configured to match an impedance of the high frequency power supply RFG and an impedance at a load side such as, mainly, the electrode, the plasma and the chamber 12. The matching device includes a blocking capacitor for self-bias generation.

The electrostatic chuck ESC is provided on the first plate 22a. The electrostatic chuck ESC has, at a processing space S side, a mounting region MR for mounting the wafer W thereon. The mounting region MR is a substantially circular region substantially perpendicular to the Z-axis, and has a diameter substantially equal to or slightly smaller than a diameter of the wafer W. Further, the mounting region MR forms a top surface of the placing table 20, and a center of the mounting region MR, that is, a center of the placing table 20 lies on the Z-axis.

The electrostatic chuck ESC is configured to hold the wafer W by an electrostatic attracting force. The electrostatic chuck ESC includes an attraction electrode embedded in a dielectric material. The attraction electrode of the electrostatic chuck ESC is connected with a DC power supply DCS via a switch SW and a coating line CL. The electrostatic chuck ESC attracts and holds the wafer W on the top surface thereof by a Coulomb force generated by a DC voltage applied from the DC power supply DCS. At an outside the electrostatic chuck ESC in a diametrical direction, a focus ring FR is disposed to surround the wafer W in a ring shape.

An annular path 24 is formed within the first plate 22a. A coolant from a chiller unit is supplied into the path 24 through a pipeline PP1. The coolant supplied into the path 24 is returned back into the chiller unit through a pipeline PP3. Further, in the etching apparatus 10, a heat transfer gas such as a He gas from a heat transfer gas supply is supplied into a gap between a top surface of the electrostatic chuck ESC and a rear surface of the wafer W through a supply line PP2.

A space is formed around the placing table 20, that is, between the placing table 20 and the sidewall 12a, and this space is configured as an exhaust path VL having an annular shape when viewed from the top. An annular baffle plate 26 having a multiple number of through holes is provided between the exhaust path VL and the processing space S. The exhaust path VL is connected to an exhaust pipe 28 through an exhaust opening 28h. The exhaust pipe 28 is provided at the bottom 12b of the chamber 12. The exhaust pipe 28 is connected with an exhaust device 30. The exhaust device 30 has a pressure controller and a vacuum pump such as a turbo molecular pump. The processing space S within the chamber 12 can be decompressed to a required vacuum level by the exhaust device 30. Further, the gas supplied onto wafer W flows, by the exhaust device 30, on a front surface of the wafer W toward an edge thereof, and is exhausted from the space around the placing table 20 through the exhaust path VL.

Further, the etching apparatus 10 in the present exemplary embodiment has heaters HT, HS, HC and HE as a temperature control device. The heater HT is provided within the ceiling 12c and extended in a ring shape to surround an antenna 14. The heater HS is provided within the sidewall 12a and extended in a ring shape. The heater HC is provided within the first plate 22a or within the electrostatic chuck ESC. The heater HC is provided under a central portion of the aforementioned mounting region MR, that is, in a region intersecting with the Z-axis. The heater HE is extended in a ring shape to surround the heater HC. The heater HE is provided under peripheral portion of the aforementioned mounting region MR.

Further, the etching apparatus 10 is equipped with an antenna 14, a coaxial waveguide 16, a microwave generator 32, a tuner 34, a waveguide 36 and a mode converter 38. The antenna 14, the coaxial waveguide 16, the microwave generator 32, the tuner 34, the waveguide 36 and the mode converter 38 constitute a plasma generating unit configured to excite the gas supplied into the chamber 12.

The microwave generator 32 is configured to generate a microwave having a frequency of, e.g., 2.45 GHz. The microwave generator 32 is connected to an upper portion of the coaxial waveguide 16 via the tuner 34, the waveguide 36 and the mode converter 38. The coaxial waveguide 16 is extended along the Z-axis which is a central axis thereof.

The coaxial waveguide 16 includes an outer conductor 16a and an inner conductor 16b. The outer conductor 16a has a cylindrical shape extending around the Z-axis. A lower end of the outer conductor 16a is electrically connected to an upper portion of a cooling jacket 40 having a conductive surface. The inner conductor 16b has a cylindrical shape extending around the Z-axis, and is provided inside the outer conductor 16a to be concentric with the outer conductor 16a. A lower end of the inner conductor 16b is connected to a slot plate 44 of the antenna 14.

In the present exemplary embodiment, the antenna 14 is a RLSA (Radial Line Slot Antenna). The antenna 14 is disposed within an opening formed at the ceiling 12c to face the placing table 20. The antenna 14 includes the cooling jacket 40, a dielectric plate 42, the slot plate 44, and the dielectric window 18. The dielectric window 18 is an example of a ceiling plate. The dielectric plate 42 has a substantially disk shape and is configured to shorten a wavelength of a microwave. The dielectric plate 42 is made of, by way of example, but not limitation, quartz or alumina, and is held between the slot plate 44 and a bottom surface of the cooling jacket 40.

Figure 7:
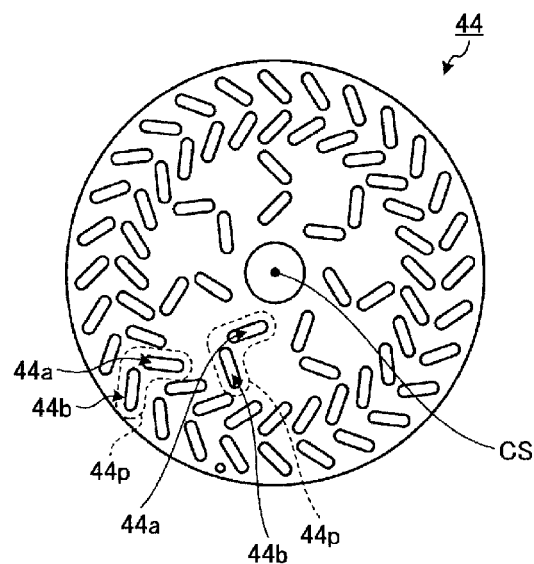
FIG. 7 is a plan view illustrating an example of a slot plate.

FIG. 7 is a plan view illustrating an example of the slot plate 44. The slot plate 44 is of a circular thin plate shape. Both surfaces of the slot plate 44 in a plate thickness direction are flat. A center CS of the slot plate 44 lies on the Z-axis. The slot plate 44 is provided with multiple slot pairs 44p. Each of the multiple slot pairs 44p includes two slot holes 44a and 44b formed through the slot plate 44 in the plate thickness direction. Each of the slot holes 44a and 44b has, for example, an elongated circular plan shape. In each of the slot pairs 44p, an extension direction of a long axis of the slot hole 44a and an extension direction of a long axis of the slot hole 44b intersect with each other or are orthogonal to each other. The multiple slot pairs 44*b* are arranged around the center CS of the slot plate 44 to surround it. In the example shown in FIG. 7, the multiple slot pairs 44*p* are arranged along two concentric circles. On each concentric circle, the slot pairs 44*p* are arranged at a substantially regular distance therebetween. The slot plate 44 is provided on a top surface 18*u* of the dielectric window 18 (see FIG. 9).

Figure 8:
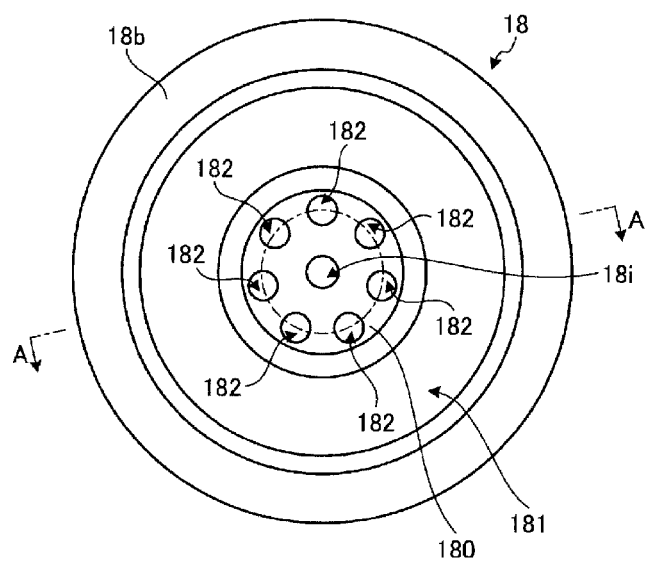
FIG. 8 is a plan view illustrating an example of a dielectric window.
Figure 9:
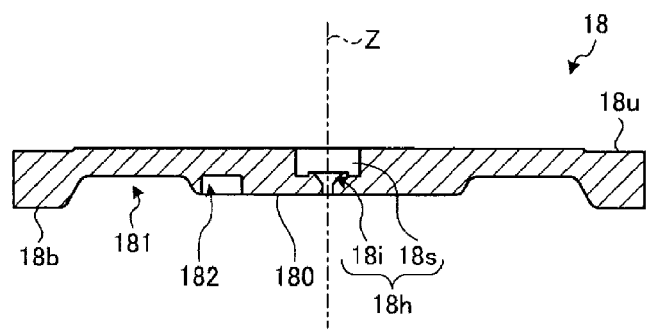
FIG. 9 is a cross sectional view taken along a line A-A of FIG. 8.

FIG. 8 is a plan view illustrating an example of the dielectric window 18, and FIG. 9 is a cross sectional view taken along a line A-A of FIG. 8. As shown in FIG. 8 and FIG. 9, for example, the dielectric window 18 is formed of a dielectric material such as quartz to have a substantially disk shape. A through hole 18*h* is formed at a center of the dielectric window 18. An upper portion of the through hole 18*h* is a space 18*s* in which an injector 50*b* of a central inlet unit 50 to be described later is accommodated, and a lower portion of the through hole 18*h* is a gas discharge opening 18*i* of the central inlet unit 50 to be described later. Further, in the present exemplary embodiment, a central axis of the dielectric window 18 coincides with the Z-axis.

A surface of the dielectric window 18 opposite from the top surface 18*u* thereof, that is, a bottom surface 18*b* is in direct contact with the processing space S. The bottom surface 18*b* is provided with various shapes formed thereat. To elaborate, the bottom surface 18*b* has a flat surface 180 in a central region surrounding the gas discharge opening 18*i*. The flat surface 180 is a plane surface perpendicular to the Z-axis. The bottom surface 18*b* also has an annular first recess 181 formed thereat. The first recess 181 is annularly extended in a region outer than the flat surface 180 in a diametrical direction, and is recessed upwards to have a tapered shape.

Further, the bottom surface 18*b* is also provided with multiple second recesses 182. The multiple second recesses 182 are recessed upwards. The number of the multiple second recesses 182 is seven in the example shown in FIG. 8 and FIG. 9. However, the number of the multiple second recesses 182 may be less than or more than seven. The second recesses 182 are arranged at a regular distance therebetween in a circumferential direction. Further, each second recess 182 has a circular plane shape on a plane orthogonal to the Z-axis.

Figure 10:
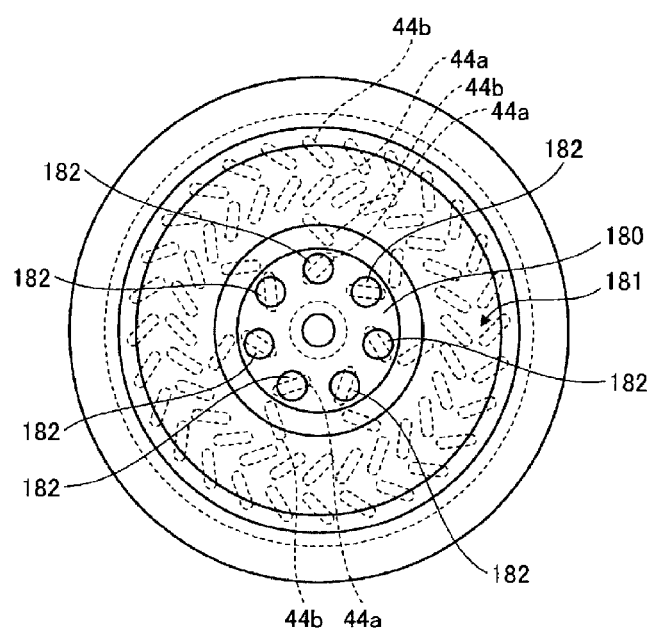
FIG. 10 is a plan view illustrating a state in which the slot plate shown in FIG. 7 is provided on the dielectric window shown in FIG. 8.

FIG. 10 is a plan view illustrating a state in which the slot plate 44 shown in FIG. 7 is provided on the dielectric window 18 shown in FIG. 8. FIG. 10 illustrates the dielectric window 18 seen from below. As shown in FIG. 10, for example, when viewed from the top, that is, when viewed from the Z-axis direction, the slot pairs 44*p* provided at the slot plate 44 along the outer concentric circle among the two concentric circles arranged in the diametrical direction are overlapped with the first recess 181 of the dielectric window 18. Further, the slot holes 44*b* of the slot pairs 44*b* provided at the slot plate 44 along the inner concentric circle are overlapped with the first recess 181 of the dielectric window 18. Furthermore, the slot holes 44*a* of the slot pairs 44*p* arranged along the inner concentric circle are overlapped with the multiple second recesses 182.

Reference is made back to FIG. 6. The microwave generated by the microwave generator 32 is transmitted to the dielectric window 42 through the coaxial waveguide 16 and propagated to the dielectric window 18 through the slot holes 44*a* and 44*b* of the slot plate 44. Directly under the dielectric window 18, energy of the microwave propagated to the dielectric window 18 is concentrated to the first recess 181 and the second recesses 182 where the dielectric window 18 has relatively thin plate thicknesses. Accordingly, the etching apparatus 10 is capable of generating the plasma while allowing the plasma to be stably distributed in the circumferential direction and the diametrical direction.

Further, the etching apparatus 10 includes the central inlet unit 50 and a peripheral inlet unit 52. The central inlet unit 50 includes a conduction line 50*a*, the injector 50*b* and the gas discharge opening 18*i*. The conduction line 50*a* is disposed inside the inner conductor 16*b* of the coaxial waveguide 16. Further, an end of the conduction line 50*a* is extended into the space 18*s* (see FIG. 9) which is formed in the dielectric window 18 along the Z-axis. The injector 50*b* is accommodated in the space 18*s* under the end of the conduction line 50*a*. The injector 50*b* is provided with a multiple number of through holes extending in the Z-axis direction. Further, the dielectric window 18 has the aforementioned gas discharge opening 18*i*. The gas discharge opening 18*i* is extended along the z-axis under the space 18*s*, and communicates with the space 18*s*. The central inlet unit 50 supplies a gas into the injector 50*b* via the conduction line 50*a* and discharges the gas into the processing space S from the injector 50*b* through the gas discharge opening 18*i*. As sated above, the central inlet unit 50 discharges the gas into the processing space S directly under the dielectric window 18 along the Z-axis. That is, the central inlet unit 50 introduces the gas into a plasma generation space having a high electron temperature within the processing space S. Further, the gas discharged from the central inlet unit 50 flows toward a central region of the wafer W substantially along the Z-axis. The gas discharge opening 18*i* is an example of a ceiling plate supply opening.

A gas source group GSG1 is connected to the central inlet unit 50 via a flow rate control unit group FCG1. The gas source group GSG1 supplies a mixed gas including multiple kinds of gases. The flow rate control unit group FCG1 includes a multiple number of flow rate controllers and a multiple number of opening/closing valves. The gas source group GSG1 is connected to the conduction line 50*a* of the central inlet unit 50 via the flow rate controllers and the opening/closing valves within the flow rate control unit group FCG1.

The peripheral inlet unit 52 is provided between the gas discharge opening 18*i* of the dielectric window 18 and the top surface of the placing table 20 in a height direction, that is, in the Z-axis direction, as shown in FIG. 6, for example. The peripheral inlet unit 52 introduces the gas into the processing space S from a position of the sidewall 12*a*. The peripheral inlet unit 52 includes a multiple number of gas discharge openings 52*i*. These gas discharge openings 52*i* are arranged along a processing space S side of the sidewall 12*a* between the gas discharge opening 18*i* of the dielectric window 18 and the top surface of the placing table 20 in the height direction.

The peripheral inlet unit 52 includes an annular pipe 52*p* made of, by way of example, but not limitation, quartz. The pipe 52*p* is provided with the multiple number of gas discharge openings 52*i*. Each gas discharge opening 52*i* discharges the gas diagonally upwards toward the Z-axis direction. The gas discharge opening 52*i* is an example of a sidewall supply opening. The peripheral inlet unit 52 according to the present exemplary embodiment has the single pipe 52*p* as shown in FIG. 6, for example. However, as another example, the peripheral inlet unit 52 may have two or more pipes 52*p* arranged in a vertical direction along an inner surface of the sidewall 12*a* of the chamber 12. A gas source group GSG2 is connected to the pipe 52*p* of the peripheral inlet unit 52 via a gas supply block 56 and a flow rate control unit group FCG2. The flow rate control unit group FCG2 includes a multiple number of flow rate controllers and a multiple number of opening/closing valves. The gas source group GSG2 is connected to the peripheral inlet unit 52 via the flow rate controller and the opening/closing valves within the flow rate control unit group FCG2. The flow rate control unit groups FCG1 and FCG2 and the gas source groups GSG1 and GSG2 are an example of a supply unit.

The etching apparatus 10 is capable of controlling a kind and a flow rate of the gas introduced into the processing space S from the central inlet unit 50 and a kind and a flow rate of the gas introduced into the processing space S from the peripheral inlet unit 52 independently. In the present exemplary embodiment, the etching apparatus 10 supplies the same kind of gas into the processing space S from the central inlet unit 50 and the peripheral inlet unit 52. Further, in the present exemplary embodiment, the flow rate of the gas supplied into the processing space S from the central inlet unit 50 and the flow rate of the gas supplied into the processing space S from the peripheral inlet unit 52 are set to be substantially same.

Furthermore, the etching apparatus 10 is equipped with a controller Cnt including a processor, a memory, and so forth, as depicted in FIG. 6, for example. The controller Cnt controls the individual components of the etching apparatus 10. Specifically, the controller Cnt controls selection of the gas(es) supplied from the gas source groups GSG1 and GSG2 and the flow rate thereof, the gas exhaust of the exhaust device 30, the microwave power from the microwave generator 32, the supply of the power from the high frequency power supply RFG, and so forth by using control signals. Furthermore, the individual processes of the etching method disclosed in the present exemplary embodiment are performed as the individual components of the etching apparatus 10 are operated under the control of the controller Cnt. A computer program for implementing the etching method according to the exemplary embodiment and various kinds of data for use in implementing this method are stored in the memory of the controller Cnt to be readable.

[Effects of Exemplary Embodiment]

An etching method includes preparing a substrate having a processing target film, multiple core members formed on the processing target film, and a first film covering the multiple core members and the processing target film exposed between the multiple core members; forming a second film on a surface of the first film by a first gas; etching the first film by plasma of a second gas while allowing the second film to be left on a portion of the first film corresponding to a side surface of each core member; and repeating the forming of the second film and the etching of the first film. Accordingly, in the etching method according to the present exemplary embodiment, a mask formed on the substrate by the etching can be suppressed from being given an abnormal shape. Further, in the etching method according to the exemplary embodiment, since a shoulder portion of the first film, which might be given an abnormal shape, can be protected by the second film serving as a protective film. Accordingly, thinning of the mask can be suppressed, and the mask is allowed to have a nearly rectangular cross sectional shape. Thus, in the etching method according to the present exemplary embodiment, a cross sectional shape of an opening formed by the etching using the mask can be made to be close to a rectangle.

Further, in the forming of the second film, the second film is formed as a molecule of the first gas is adsorbed onto the surface of the first film. Accordingly, in the etching method according to the exemplary embodiment, the protective film can be formed without using plasma.

Furthermore, in the forming of the second film, the second film is formed as a replacement reaction takes place between a hydroxyl group existing on the surface of the first film and the molecule of the first gas. Accordingly, in the etching method according to the exemplary embodiment, the protective film can be formed by using a replacement reaction.

Moreover, in the forming of the second film, the second film having a thickness corresponding to a single molecular layer is formed. Accordingly, in the etching method according to the exemplary embodiment, the protective film can be formed rapidly, so that a throughput of the mask formation can be improved.

Further, the first gas is an aminosilane-based gas or a silicon alkoxide-based gas. Accordingly, in the etching method according to the exemplary embodiment, the protective film having a thickness of a single molecular layer of a silicon oxide can be formed rapidly, so that the throughput of the mask formation can be improved.

In addition, the etching of the first film is ended before the second film left on the portion of the first film corresponding to the side surface of each core member is removed. Accordingly, in the etching method according to the exemplary embodiment, the protective film is allowed to be left at a position where abnormality of the shape may occur. Thus, abnormality in the shape of the mask can be further suppressed.

In the etching of the first film, the first film is etched under a condition that an etching rate of the portion of the first film corresponding to the side surface of each core member is smaller than an etching rate of other portions of the first film. Accordingly, in the etching method according to the exemplary embodiment, it is possible to perform the etching while protecting the portion of the first film corresponding to the side surface of each core member by the protective film.

Further, the forming of the second film and the etching of the first film are repeated until a top portion of each core member and the processing target film between the multiple core members are exposed. Accordingly, in the etching method according to the exemplary embodiment, by repeating these processes until the processing target film is exposed, the mask suppressed from having an abnormal shape can be formed.

Moreover, the etching method further includes removing each exposed core member selectively after the repeating of the forming of the second film and the etching of the first film is completed; and etching the processing target film with the remaining first film as a mask. Accordingly, in the etching method according to the exemplary embodiment, a required pattern can be formed by the etching using the mask suppressed from having an abnormal shape.

Additionally, the etching method further includes etching, after the repeating of the forming of the second film and the etching of the first film is completed, the processing target film with each exposed core member and the first film left on the side surface of each core member as a mask. Accordingly, in the etching method according to the exemplary embodiment, the required pattern can be formed by the etching using the mask suppressed from having an abnormal shape.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

By way of example, though the microwave plasma processing apparatus using the RLSA is described as the example of the etching apparatus 10 in the above-described exemplary embodiment, the present disclosure is not limited thereto. The disclosed technique is also applicable to any of various kinds of plasma processing apparatuses using other mechanisms such as CCP (Capacitively Coupled Plasma) and ICP (Inductively Coupled Plasma) as long as they are apparatuses configured to perform a processing by using plasma.

According to the present disclosure, it is possible to suppress abnormality in a shape of a mask formed on the substrate by the etching.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. An etching method, comprising:
    preparing a substrate having a processing target film, multiple core members formed on the processing target film, and a first film covering the multiple core members and the processing target film exposed between the multiple core members;
    forming a second film on a surface of the first film by a first gas;
    etching the first film by plasma of a second gas while allowing the second film to be left on a portion of the first film corresponding to a side surface of each core member;
    determining whether a top portion of each core member and the processing target film are exposed;
    repeating the forming of the second film and the etching of the first film if the top portion of each core member and the processing target film are not exposed; and
    etching the processing target film if the top portion of each core member and the processing target film are exposed.

2. The etching method of claim 1,
    wherein in the forming of the second film, the second film is formed as a molecule of the first gas is adsorbed onto the surface of the first film.

3. The etching method of claim 2,
    wherein in the forming of the second film, the second film is formed as a replacement reaction takes place between a hydroxyl group existing on the surface of the first film and the molecule of the first gas.

4. The etching method of claim 1,
    wherein in the forming of the second film, the second film having a thickness corresponding to a single molecular layer is formed.

5. The etching method of claim 1,
    wherein the first gas is an aminosilane-based gas or a silicon alkoxide-based gas.

6. The etching method of claim 1,
    wherein the etching of the first film is ended before the second film left on the portion of the first film corresponding to the side surface of each core member is removed.

7. The etching method of claim 1,
    wherein in the etching of the first film, the first film is etched under a condition that an etching rate of the portion of the first film corresponding to the side surface of each core member is smaller than an etching rate of other portions of the first film.

8. The etching method of claim 1,
    wherein the forming of the second film and the etching of the first film are repeated until the top portion of each core member and the processing target film between the multiple core members are exposed.

9. The etching method of claim 8, further comprising:
    removing each exposed core member selectively after the repeating of the forming of the second film and the etching of the first film is completed; and
    etching the processing target film with the remaining first film as a mask.

10. The etching method of claim 8, further comprising:
    etching, after the repeating of the forming of the second film and the etching of the first film is completed, the processing target film with each exposed core member and the first film left on the side surface of each core member as a mask.

11. The method according to claim 1, wherein after the step of determining, the first film is not deposited.

* * * * *